United States Patent

Kurita et al.

Patent Number: 6,012,158
Date of Patent: Jan. 4, 2000

[54] DECODING APPARATUS AND DECODING METHOD

[75] Inventors: Yasuhiro Kurita, Tokorozawa; Tadayuki Hattori, Ichikawa; Kazuhiko Seki, Tokyo, all of Japan

[73] Assignee: Uniden Corporation, Tokyo, Japan

[21] Appl. No.: 08/770,643

[22] Filed: Dec. 19, 1996

[30] Foreign Application Priority Data

Sep. 17, 1996 [JP] Japan .................................. 8-245312

[51] Int. Cl.[7] .................................................. H03M 13/00
[52] U.S. Cl. ........................................ 714/752; 714/758
[58] Field of Search ..................................... 714/752, 758

[56] References Cited

U.S. PATENT DOCUMENTS

| | | | |
|---|---|---|---|
| 4,785,451 | 11/1988 | Sako et al. | 371/37.5 |
| 4,914,660 | 4/1990 | Hirose | 371/37.08 |
| 5,459,741 | 10/1995 | Iwamura | 371/37.1 |
| 5,541,939 | 7/1996 | Im | 371/40.3 |
| 5,701,314 | 12/1997 | Armstrong et al. | 371/40.3 |
| 5,771,248 | 6/1998 | Katayama et al. | 714/752 |

FOREIGN PATENT DOCUMENTS

| | | |
|---|---|---|
| 4-262623 | 9/1992 | Japan . |
| 4-267650 | 9/1992 | Japan . |
| 6-13953 | 1/1994 | Japan . |
| 6-53841 | 2/1994 | Japan . |
| 6-169261 | 6/1994 | Japan . |
| 6-284016 | 10/1994 | Japan . |
| 6-303149 | 10/1994 | Japan . |
| 6-303221 | 10/1994 | Japan . |
| 7-30524 | 1/1995 | Japan . |

*Primary Examiner*—Hoa T. Nguyen
*Assistant Examiner*—Shelly A Chase
*Attorney, Agent, or Firm*—McDermott, Will & Emery

[57] ABSTRACT

In a case where error correction code interleaved in the transmitting side and deinterleaved in the receiving side is subjected to decoding processing, a control circuit determines whether a result of decoding for each word is acceptable or not according to decoding acceptable/unacceptable data for each word stored in a decoding acceptable/unacceptable data memory, and subjects a correction object word not decoded to redecoding processing by controlling an error position estimating circuit and correcting data for the correction object word with an estimated error locator based on error position data for a forward word as well as a backward word from the correction object word.

17 Claims, 10 Drawing Sheets

FIG.7

|  | [BIT STATE] | [BCH DECODER ACCEPTABLE/UNACCEPTABLE] |
|---|---|---|
| WORD0 | :................1............ | ○ |
| WORD1 | :.............................. | ○ |
| WORD2 | :.........................11.. | ○ |
| WORD3 | :........3...3............2.. | ○ |
| WORD4 | :......N..N..N.N..........N.. | ✕ |
| WORD5 | :........1.....1.............. | ○ |
| WORD6 | :3........3.....2............ | ○ |
| WORD7 | :1................1.......... | ○ |

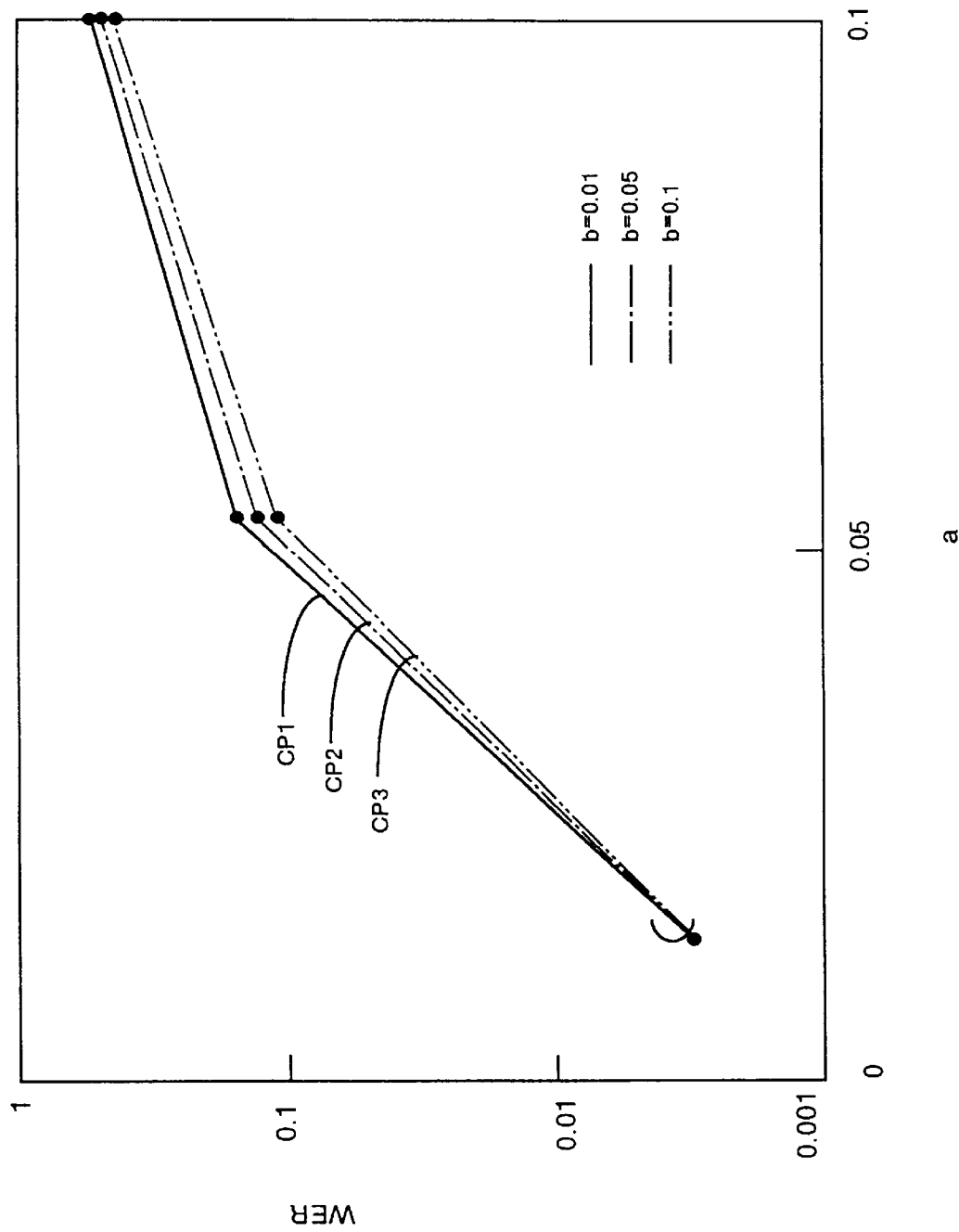

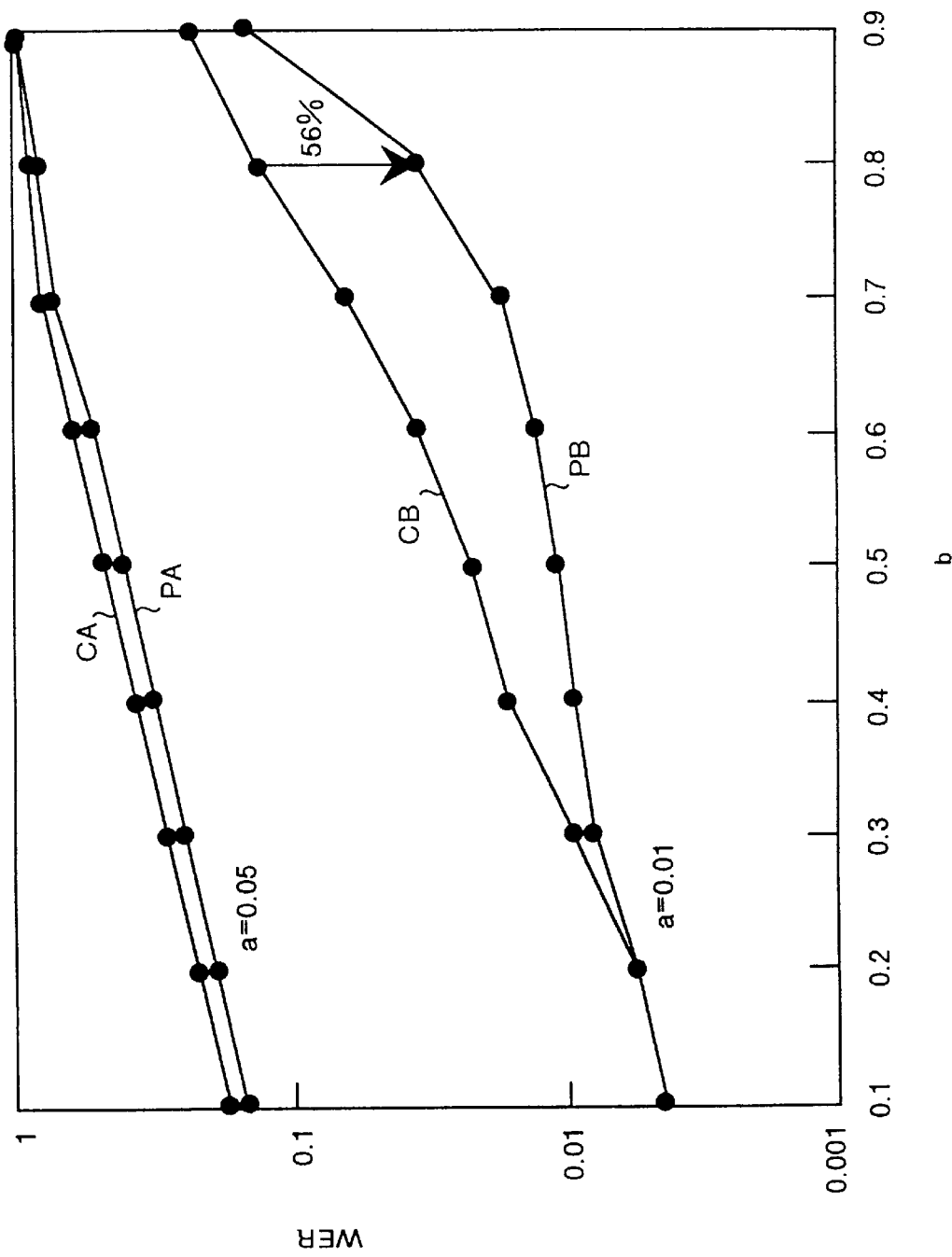

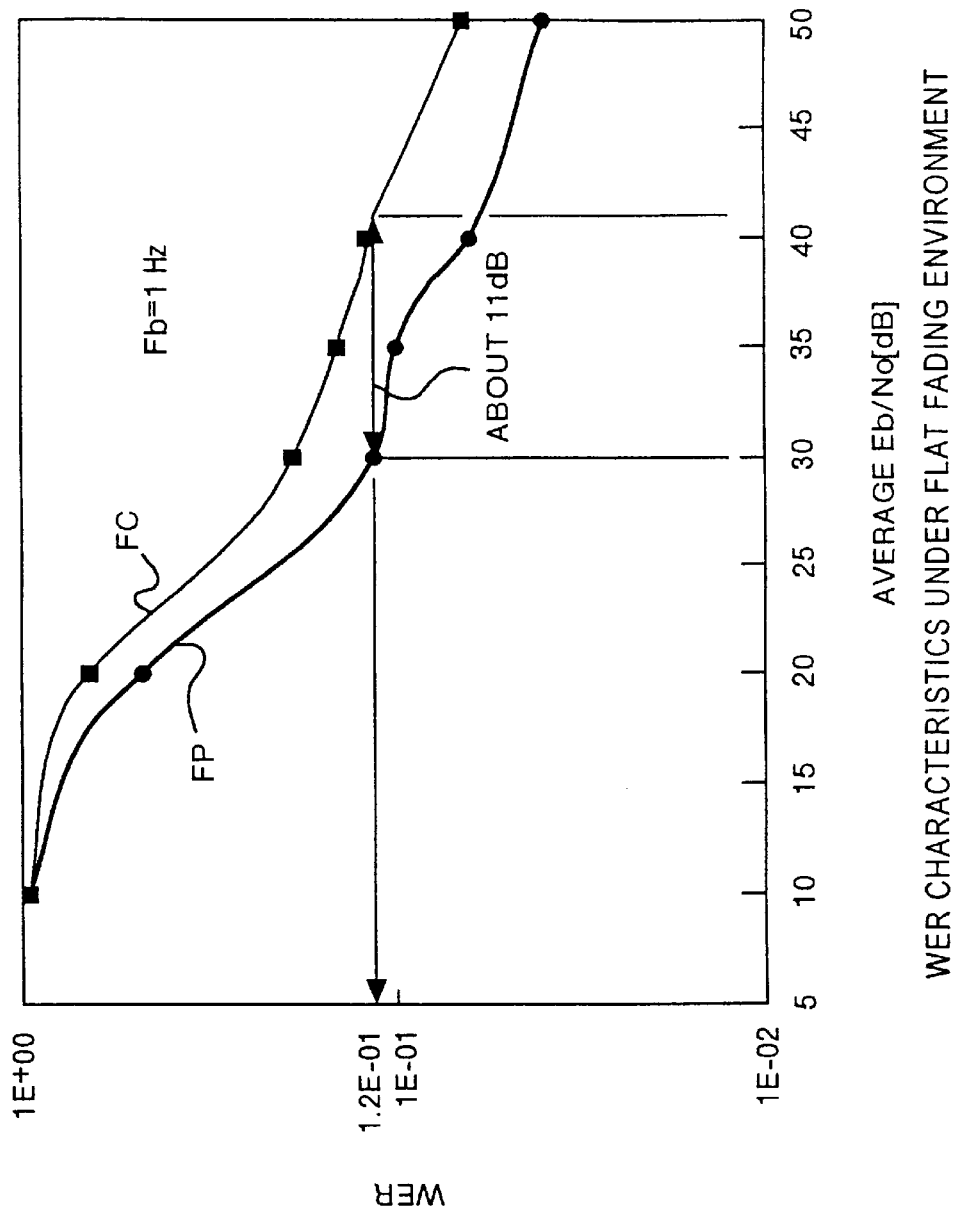

DECODING APPARATUS AND DECODING METHOD

FIELD OF THE INVENTION

The present invention relates to a decoding apparatus and a decoding method, and more particularly to a decoding apparatus and a decoding method for decoding error correction code interleaved in the transmitting side and deinterleaved in the receiving side.

BACKGROUND OF THE INVENTION

In the field of radio communication systems, for the purpose to prevent increase of a code error ratio due to a burst error, generally Bose-Chaudhuri-Hocquenghem (BCH) error correction code (described as BCH code hereinafter), which is representative of multiple error correction cyclic code, is used.

As an example of a radio communication system, there is an advanced radio calling system (RCR STD-43) which selectively calls a pager as a mobile unit. This advanced radio calling system interleaves a BCH code and transmits the BCH code as a call signal to each pager.

Each pager has a decoder, deinterleaves the BCH codes according to the received call signal, and decodes the BCH code with the decoder into blocks each consisting of a plurality of words.

It should be noted that, as a technology similar to that described above, there has been disclosed, for instance, Japanese Patent Laid-Open Publication No. HEI 6-169261. This patent publication discloses a technology for selecting decoded data from among a plurality of types of candidate decoded data by referring to a metric indicating probability of a result of decoding as a reference when an error is detected.

However, in the decoder based on the conventional technology as described above, in a case where an error surpassing the BCH code error correction capability is generated in each word in a decoding process, a word error is generated, which makes it impossible to decode the BCH code.

SUMMARY OF THE INVENTION

It is an object of the present invention to provide a decoding apparatus and a decoding method for enabling improvement of the decoding capability by using burst errors successively generated in time series and by reducing a word error ratio in error correction code.

As explained above, a decoding apparatus according to the present invention estimates an error position for a correction object word which cannot be decoded according to error position data from a word adjoining the correction object word, corrects the estimated error position, and executes redecoding processing; whereby continuity of error is obtained from the word adjoining the correction object word which cannot be decoded; as a result, a word error ratio in error correction code decreases, which insures improvement of the decoding capability.

The decoding apparatus according to the present invention estimates an error position for the correction object word which cannot be decoded according to error position data from a forward word and a backward word of the correction object word, corrects the estimated error position, and executes redecoding processing; whereby continuity of error is obtained from the forward word and the backward word from the correction object word which cannot be decoded; as a result, a word error ratio in error correction code decreases, which insures improvement of the decoding capability of the decoding apparatus.

A decoding apparatus according to the present invention stores therein error position data for one block comprising a plurality of words, whereby the decoding apparatus can easily obtain error position data for a forward word and a backward word from a correction object word from a memory.

A decoding apparatus according to the present invention estimates a bit position with the highest probability of an error in one word as an error position according to error position data for a forward word and a backward word, whereby the decoding apparatus can estimate an error position near the correction object word at high accuracy.

A decoding apparatus according to the present invention inverts a bit at a bit position of the correction object word corresponding to the estimated error position; whereby it can be assumed that the bit at the error position is corrected, and for this reason the decoding apparatus can execute redecoding processing according to the assumption.

In a decoding apparatus according to the present invention, an error correction code is a BCH error correction code, which makes it possible to obtain a decoding apparatus suitable for multiple error correction.

A decoding method according to the present invention comprises steps of estimating an error position for a correction object word which cannot be decoded according to error position data for a word adjoining to the correction object word, correcting the estimated error position, and executing redecoding processing; whereby continuity of error is obtained from the word adjoining the correction object word which cannot be decoded; as a result, a word error ratio in error correction code decreases, which insures improvement of the decoding capability.

A decoding method according to the present invention comprises steps of estimating an error position for the correction object word which cannot have been decoded according to error position data from a forward word and a backward word from the correction object word, correcting the estimated error position, and executing redecoding processing; whereby continuity of error is obtained from the forward word and the backward word from the correction object word which cannot have been decoded; as a result, a word error ratio in error correction code decreases, which insures improvement of the decoding capability.

Other objects and features of this invention will become understood from the following description with reference to the accompanying drawings.

BRIEF DESCRIPTION OF THE DRAWINGS

FIG. 7 is a view showing an example of correction of an error in BCH code;

FIG. 8 is a view showing an example of a word error ratio characteristic relating to the probability of generation in a computer simulation;

FIG. 9 is a view showing an example of a word error ratio characteristic relating to the probability of continuity in a computer simulation; and FIG. 10 is a view showing an example of a word error ratio characteristic under flat fading environment in a computer simulation.

DESCRIPTION OF THE PREFERRED EMBODIMENTS

Next, a detailed description is made for preferred embodiments of the present invention with reference to the attached drawings.

Figure 1:
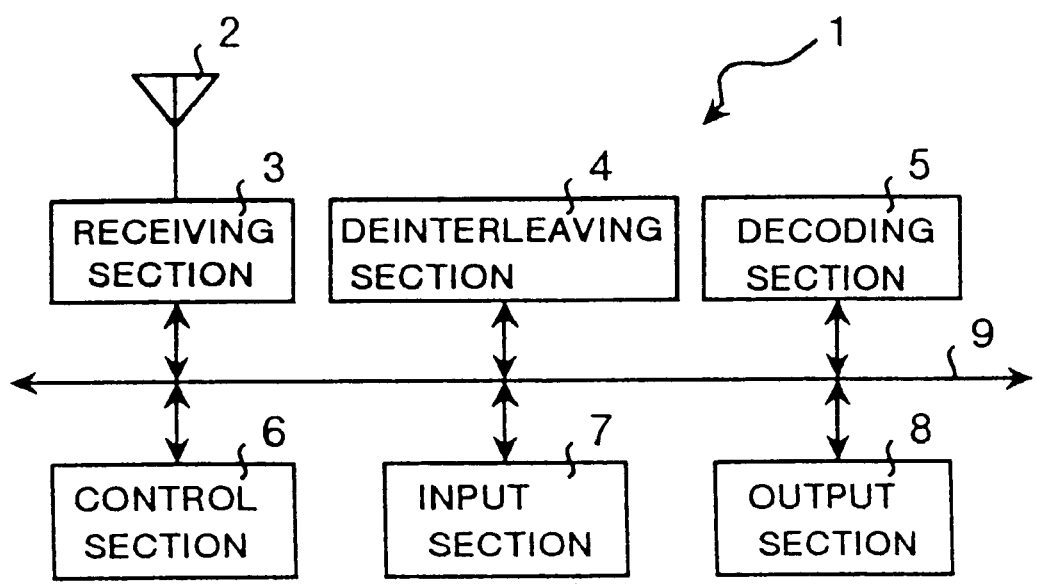
FIG. 1 is a block diagram showing a selective caller/receiver according to a preferred embodiment of the invention.

FIG. 1 is a block diagram showing an embodiment of a selective caller/receiver in which the decoding apparatus according to the present invention is applied. In this figure, the reference numeral 1 indicates a selective caller/receiver used in an advanced radio calling system.

This advanced radio calling system employs a system in which data for 128 frames are transmitted for every 4 minutes, and a modulating system/transmission speed indicating a frame type is assigned to each frame. There are the following 4 types of this modulating system/transmission speed; two-value Frequency-Shift Keying (FSK) system/ 1600 bits per second (BPS), two-value FSK system/3200 BPS, four-value FSK system/3200 BPS, and four-value FSK system/6400 BPS.

BCH code is employed in this advanced radio calling system, and the BCH code is interleaved when transmitted, deinterleaved by a selective caller/receiver 1 on a receiving side, and then is subjected to BCH decoding.

The selective caller/receiver 1 comprises an antenna 2, a receiving section 3, a deinterleaving section 4, a decoding section 5, an input section 7, and an output section 8 each connected via a bus 9 to a control section 6. This selective caller/receiver 1 receives signals modulated by a modulation system, and has a transmission speed assigned to each frame as described above.

The antenna 2 receives an electric wave radio-transmitted from a base station not shown herein, converts the electric wave to electric signals, and outputs the electric signals to the receiving section 3. The receiving section 3 detects and demodulates the electric signals fetched in by the antenna 2, namely the call signals.

The deinterleaving section 4 deinterleaves interleaved 16-bit data with a transmission speed of 3200 BPS (two-value/four-value) or 32-bit data with a transmission speed of 6400 BPS (four-value) by rearranging the data to serial data for each phase.

The decoding section 5 combines data deinterleaved in the deinterleaving section 4, namely BCH code into blocks each consisting of a plurality of words, and corrects errors estimating an error position or error positions in one word in a decoding process. In this embodiment, one block consists of 8 words, and 1 word comprises 32-bit data.

The control section 6 is a unit for controlling the selective caller/receiver 1 as a whole, and controls each section connected to the bus 9 according to a program. The input section 7 has various types of key for executing operations required for selectively calling. The output section 8 comprises an LCD (liquid crystal display device) displaying a received message or the like, an LED (light-emitting diode) indicating reception of a signal, a vibrator, a buzzer or the like.

Figure 2:
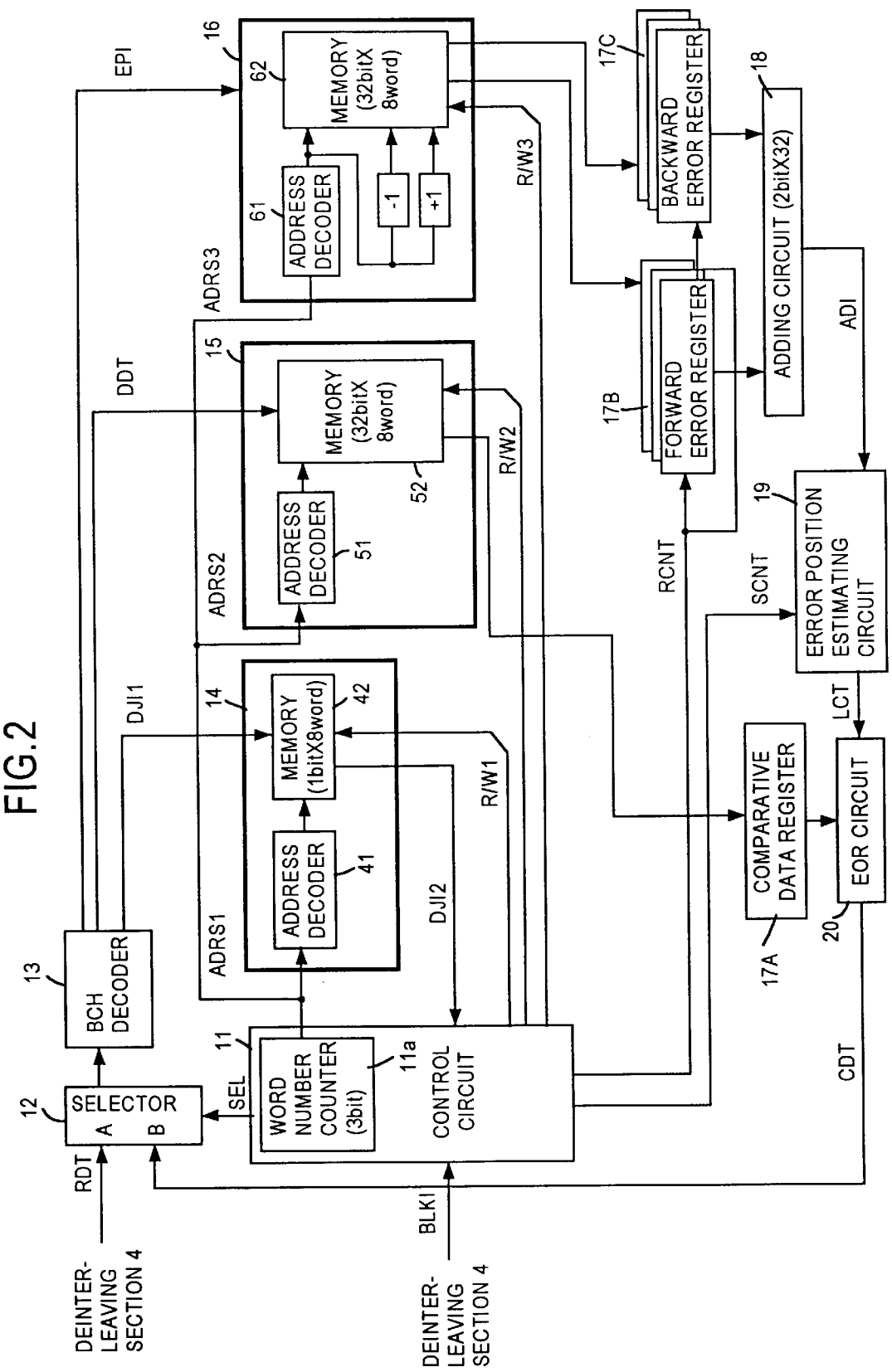
FIG. 2 is a block diagram showing the decoding apparatus according to the preferred embodiment of the present invention.

Then detailed description is made for the decoding section 5. FIG. 2 is a block diagram showing internal configuration of the decoding section 5, an embodiment of the decoding apparatus according to the present invention.

The decoding section 5 has a control circuit 11 for controlling all operations for decoding. This control circuit 11 is connected to a selector 12, a decoding acceptable/ unacceptable data memory 14, a decoded data memory 15, an error position data memory 16, a forward error register 17B, a backward error register 17C, an error position estimating circuit 19, an EOR circuit 20, and the deinterleaving section 4.

The control circuit 11 comprises a word number counter 11a, a CPU, a ROM, a RAM each not shown herein, or the like, operates the CPU according to a control program stored in the ROM, and then uses the RAM as a work area. The word number counter 11a has a memory capacity of 3 bits, and counts 8 words from 0 to 7.

The selector 12 selects a destination for input to input A where a BCH code deinterleaved under control by the control circuit 11 is fetched in, or input B where temporally corrected data CDT for redecoding is fetched in, and outputs the BCH code or the temporally corrected data CDT to the BCH decoder 13 according to the selection.

The BCH decoder 13 receives and decodes the BCH code outputted from the selector 12, and obtains decoded data DDT, decoding acceptable/unacceptable data DJI1 indicating whether decoded data is acceptable or not for each word, and produces error position data EPI for each word as a result of decoding. This BCH decoder 13 supplies the decoding acceptable/unacceptable data DJI1 to the decoding acceptable/unacceptable data memory 14, supplies the decoded data DDT to the decoded data memory 15, and supplies the error position data EPI to the error position data memory 16.

The decoding acceptable/unacceptable data memory 14 has an address decoder 14 and a memory 42. The address decoder 41 decodes the address data ADRS1 supplied from the control circuit 11 and provides an address to the memory 42.

The memory 42 has a memory capacity (1 bit×8 words) enough to store the decoding acceptable/unacceptable data DJI1 for each word in one block. This memory 42 writes the decoding acceptable/unacceptable data DJI1 at an address provided by the address decoder 41 or reads out the decoding acceptable/unacceptable data DJI1 provided by the address decoder 41 as a decoding acceptable/unacceptable data DJI2 and supplies the data to the control circuit 11 according to read/write data R/W1 in the control circuit 11.

The decoded data memory 15 has an address decoder 51 and a memory 52. The address decoder 51 decodes address data ADRS 2 supplied from the control circuit 11 and provides the address to the memory 52.

The memory 52 has a memory capacity (32-bit×8 words) to store decoded data DDT for one block (8 words). This memory 52 writes the decoded data at an address provided by the address decoder 51 or reads out the decoded data DDT at an address instructed by the address decoder 51 and supplies the data to a comparative data register 17A according to read/write data R/W2 from the control circuit 11.

The error position data memory 16 has an address decoder 61 and a memory 62. The address decoder 61 provides a forward word and a backward word, when an address is supplied to the memory 62 by decoding the address data ADRS3 supplied from the control circuit 11, for a remarked word identified according to the instructed address.

The memory 62 has a memory capacity (32 bits×8 words) for storing the error position data EPI for 1 block (8 words). This memory 62 writes the error position data EPI at an address instructed by the address decoder 61, reads the error position data EPI for the words before and after the remarked word provided by the address decoder 61, and supplies the data to a forward error register 17B and to a backward error register 17C according to the write/read data R/W3 from the control circuit 11.

The comparative data register 17A stores therein decoded data for one word supplied from the memory 52. The forward error register 17B and backward error register 17C have a shift register structure consisting of 32 bits respectively, store therein error position data EPI for one word supplied from the memory 62 according to register control signal RCNT supplied from the control circuit 11, and also outputs the error position data EPI stored in registers just before and just behind it to the adding circuit 18 for each bit position.

It should be noted that the resister control signal RCNT also works as a signal for shifting bit data stored in each register by 1 bit.

The adding circuit 18 is a circuit which sums up error position data EPI supplied from the forward error register 17B and the backward error register 17C to obtain a result of addition of 2-bit data for one bit position of one of 32 bits each constituting one word, and outputs addition result data ADI (2 bits×32 pieces) indicating a result of addition to the error position estimating circuit 19.

The error position estimating circuit 19 estimates a bit position with the highest probability of error among addition result data ADI supplied from the adding circuit 18 as an error position, and outputs an estimated error locator LCT with the bit for the error position having been converted to an effective bit to the EOR circuit 20. It should be noted that this error position estimating circuit can be realized by either hardware or software.

An input terminal of the EOR circuit 20 is connected to the comparative data register 17A as well as to the error position estimating circuit 19, and an output terminal of the EOR circuit 20 is connected to the selector 12. The EOR circuit 20 computes an exclusive logical sum between the decoded data DDT supplied from the comparative data register 17A and the estimated error locator LCT supplied from the error position estimating circuit 19, and outputs the result as temporally corrected data (1 word: 32 bits) to the selector 12.

Next, a description is made for operations.

In the selective caller/receiver 1 shown in FIG. 1, when a call signal is received by the receiving section 3 via the antenna 2 in response to a selective call from a base station not shown herein, signal detection and demodulating are executed according to the call signal in the receiving section 3. The resultant demodulated data is outputted to the deinterleaving section 4 and rearranged according to the modulating system and transmission speed specified by the call signal.

The data rearranged in the deinterleaving section 4 is outputted as BCH code block by block (32 bits×8 words) to the decoding section 5. In the output section 8, such operations as reporting or message display are executed based on the data decoded in this decoding section 5.

Next, a detailed description is made for operations of the decoding section 5.

Figure 3:
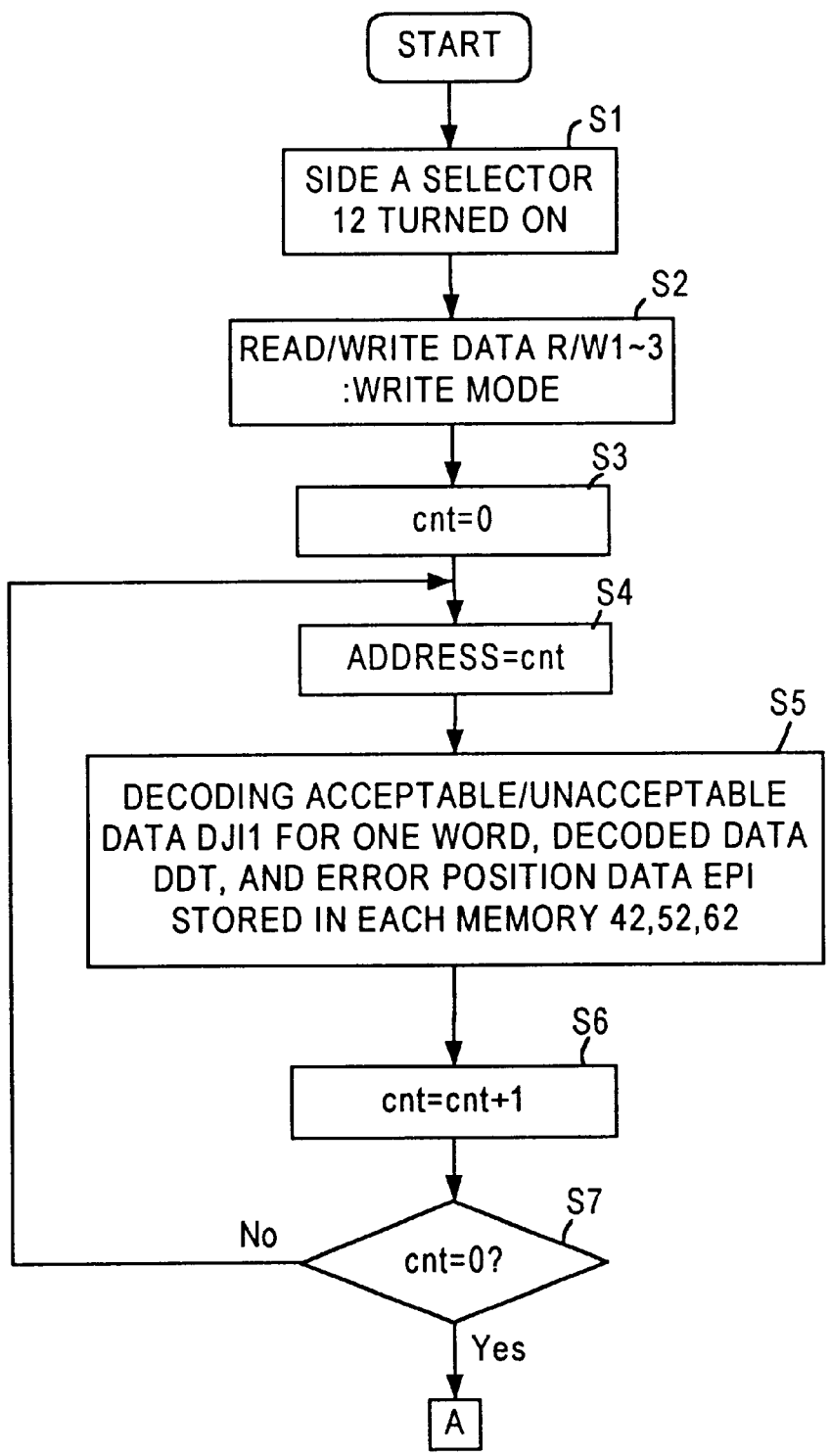
FIG. 3 is a flow chart showing a decoding operation in this embodiment.
Figure 4:
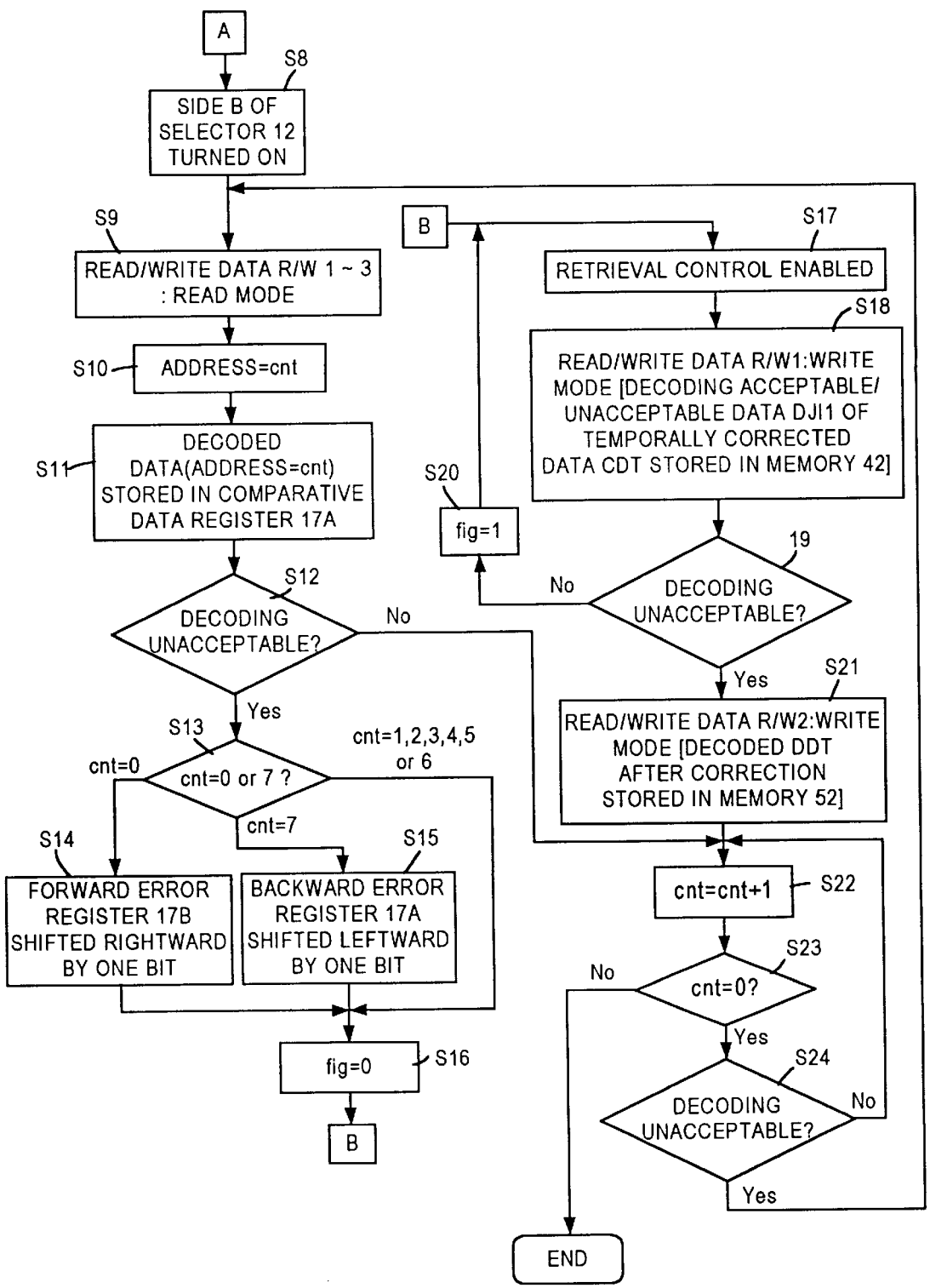
FIG. 4 is a flow chart showing a decoding operation in this embodiment.

FIG. 3 and FIG. 4 are flow charts each illustrating operations for decoding under control by the control circuit 11. It should be noted that, although the operations described below are executed in the control circuit 11, each operation is executed in each circuit.

The control circuit 11 fetches the BCH code RDT by each block (32 bits×8 words) by receiving block end data BLKI from the deinterleaving section 4. In this case, a select signal SEL for specifying the side A or side B is previously outputted to the selector 12, and in the selector 12 the side A is turned ON (step S1).

When the side A of the selector 12 is turned ON in step S1, the BCH code RDT for one block is fetched via the side A into the BCH decoder 13. When decoding is complete in this BCH decoder 13, decoding acceptable/unacceptable data DJI1 for each word, decoded data DDT for each word, error position data EPI for each bit in each word, each constituting one block, are stored in the decoding acceptable/unacceptable data memory 14 (memory 42), decoded data memory 15 (memory 52), and error position data memory 16 (memory 62), respectively.

When operations for storage are started based on a result of the decoding operations as described above, read/write data R/W1 to 3 are set in the write mode (step S2), and a counter cnt is initialized to "0" (step S3). This counter cnt is provided in the word number counter 11a, and word 0 to word 7 are counted up one by one.

Then a value of "0" for the counter cnt is written at an address (step S4), and access is made to each of the decoding acceptable/unacceptable data memory 14, decoded data memory 15, and error position data memory 16 according to the address "0". Namely, the address "0" is supplied as address data ADRS1 to the decoding acceptable/unacceptable data memory 14, as address data ADRS2 to the decoded data memory 15, and as ADRS3 to the error position data memory 16.

In the decoding acceptable/unacceptable memory 14, access is made to a write destination address (word 0) in the memory 42 obtained by decoding the address data ADRS1, and the decoding acceptable/unacceptable data DJI1 (1 bit) corresponding to the word 0 sent from the BCH decoder 13 is stored at the address (step S5).

In the decoded data memory 15, access is made to the write destination address (word 0) in the memory 52 obtained by decoding the address data ADRS2, and the decoded data DDT (32 bits) for one word corresponding to word 0 sent from the BCH decoder 13 is stored at the address (step S5).

In the error position data memory 16, access is made to the write destination address (word 0) in the memory 62 obtained by decoding the address data ADRS3, and the error position data EPI (32 bits) for one word corresponding to word 0 sent from the BCH decoder 13 is stored at the address (step S5).

Then, the counter cnt is incremented by one with the counter value cnt set to "1" (step S6), and in this step the counter value has not been returned to 0 (a starting value), so that system control returns to step S4 (step S7).

Then, the value "1" for the counter cnt is written at an address (step S4), and like in a case of word 0, the decoding acceptable/unacceptable data DJI1, decoded data DDT, and error position data EPI each for word 1 are stored in the respective memories. And from this step on, operations in steps S4 up to S7 are repeatedly executed until the value "0" for the counter cnt is obtained (step S7).

As a result, decoding acceptable/unacceptable data DJI1 for each word in one block is stored in the memory 42, decoded data DDT for one block is stored in the memory 52, and error position data EPI for each bit in each word in one block is stored in the memory 62.

Then system control shifts from step S7 to step S8. In step S8, a select signal SEL is outputted to the selector 12 so that the side B of the selector 12 is turned ON. By switching to the side B, now an operation for estimating an error position is started.

Then, the read/write data R/W 1 to 3 are set in the read mode (step S9), and as the counter cnt has already stored data for 1 block and the value has returned to "0", the value "0" is set at an address (step S10).

Then, the address data ADRS2 is outputted to the decoded data memory 15, when the address data ADRS2 is decoded by the address decoder 51. As a result, the word 0 is accessed in the memory 52, and the decoded data DDT is read from the address and is stored in the comparative data register 17A (step S11).

Then, to check whether decoded data for this word 0 is acceptable or unacceptable, the address data ADRS1 is outputted to the decoding acceptable/unacceptable data memory 14 is outputted, when this address data ADRS1 is decoded by the address decoder 41. As a result, access is made to word 0 in the memory 42, and the decoding acceptable/unacceptable data DJI2 is read from there and is outputted to the control circuit 11.

In the control circuit 11, determination is made as to whether the decoded data DDT for word 0 is acceptable or unacceptable according to the decoding acceptable/unacceptable data DJI2, and if it is determined that a result of decoding is acceptable, system control shifts to step S20, and if it is determined that the result of decoding is unacceptable, system control shifts to step S13 (step S12).

When system control shifts to step S13, determination is made for a value currently set in the counter cnt. As the current value in the counter cnt is 0, system control shifts to step S14. It should be noted that a value of the counter cnt is 7 (cnt=7), system control shifts to step S15, and in a case where a value of the counter cnt is any of 1, 2, 3, 4, 5 or 6, system control shifts to step S16.

Now in this step S14, the bit data stored in the forward error register 17B is shifted rightward by one bit according to a register control signal RCNT. This operation is executed to maintain continuity of a burst error.

Also when system control shifts to step S15, in this step S15, the bit data stored in the backward error register 17C is shifted leftward by one bit according to the register control signal RCNT. This operation is made, like in the case of the forward error register 17B, to maintain continuity of a burst error.

After the steps S13 to S15, system control shifts to step S16, a flag flg is reset to "0", and in the subsequent step S17, retrieval control is enabled. The flag flg is a parameter, and is used for determination for initialization of parameters in operations of the error position estimating circuit 19 described later. The setting for enabling is executed so that the error position estimating circuit 19 can always be operated.

Then the read/write data R/W1 is written in the write mode (step S18).

After execution of operations in steps S13 to S15, in the internal circuit, error position data for one word in the forward error register 17B and error position data for one word in the backward error register 17C are outputted to and summed in the adding circuit 18. In this step, a 2-bit area is provided for one bit position, and a result of addition is any of "0" (00B: B indicates a binary mode), "1" (01B), and "2" (10B).

When retrieval control is enabled, a retrieval control signal SCNT is sent to the error position estimating circuit 19, and from the addition result data ADI supplied from the adding circuit 18 to the error position estimating circuit 19, a bit position with the highest error probability is estimated as an error position. An estimated error locator LCT with only a bit for the error position converted to an effective bit is prepared, and the estimated error locator LCT is outputted to the EOR circuit 20.

In the EOR circuit 20, an exclusive logical sum is computed between the decoded data DDT (assuming that decoding was unacceptable) for word 0 supplied from the comparative data register 17A and the estimated error locator LCT supplied from the error position estimating circuit 19, and the result is outputted as temporally corrected data CDT (1 word: 32 bits) to the selector 12.

The temporally corrected data CDT for word 0 is outputted via the selector 12 (side B) to the BCH decoder 13, and is subjected to redecoding processing there.

In this step, as the write mode has been set only in the decoding acceptable/unacceptable data memory 14, the address data ADRS1 is supplied to the decoding acceptable/unacceptable data memory 14, and the decoding acceptable/unacceptable data DJI1 for word 0 redecoded as described above is written in the memory 14 (step S18).

In this step, the decoding acceptable/unacceptable data DJI2 for word 0 is read out from the memory 42, and determination is made for a result of decoding (step S19). If it is determined again that a result of decoding is acceptable, system control shifts to step S20, and the flag flg is set to "1". This operation is executed to prevent parameters from being initialized in a case where a result of decoding is not accepted even after corrected once. Then the system control shifts to step S17.

When system control shifts to step S18, from the addition result data ADI for word 0 stored in the error position estimating circuit 19, a bit position with the second highest error probability is estimated as an error position, and the operations as described above are executed. Thus, in a case when a result of redecoding is acceptable, redecoding is executed searching error probabilities in the same word in the ascending order.

In a case where it is determined in step S19 that a result of decoding is unacceptable, system control shifts to step S21. In step S21, read/write R/W2 is set in the write mode, and the decoded data DDT obtained by redecoding word 0 is stored in the memory 52. Namely, if one word can not correctly be decoded even after decoded again, the decoded data DDT is stored in the state where decoding is impossible.

In the next step S22, the counter cnt is incremented by one, and a value of the counter cnt is set to 1 (cnt=1). In this case, determination is made as to whether the decoded data DDT for word 1 is an object for error correction or not.

In the next step S23, a value of the counter cnt returns to "0", and determination is made as to whether decoding error checking has been finished for all the words in one block or not. If it is determined that decoding error checking has been finished for all the words in the block, the processing is terminated, but in this step a value of the counter cnt is "1", indicating that the decoding error checking has not been finished for all the words in the block, so that system control shifts to step S24.

In step S24, the read/write R/W1 is set in the read mode, and then the decoding acceptable/unacceptable data DJI2 for word 1 is read out, and determination is made as to whether a result of decoding is acceptable or unacceptable. If it is determined that the result of decoding is acceptable, system control returns to step S22, and a value of the counter cnt is incremented by one.

Namely, in step S24, so far as it is determined that a result of decoding is acceptable (until a value of the counter cnt returns to "0"), the counter cnt is successively incremented (step S22). Namely, the word number is incremented in the ascending order.

In the steps S22 to S24, if any word not decoded in step S24 has been detected, system returns to step S9, and the same processing as the error correcting operation for word 0 is executed.

Figure 5:
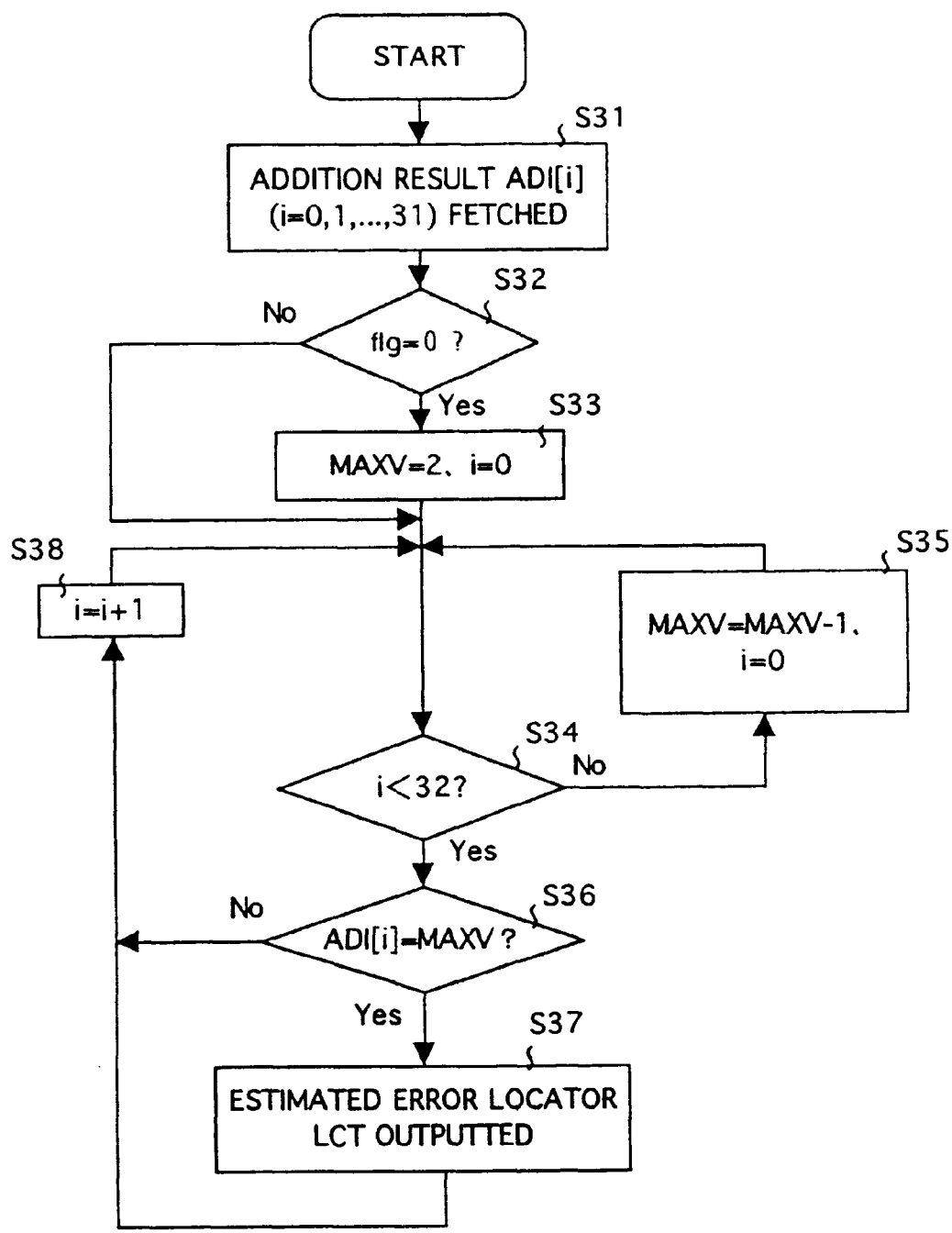
FIG. 5 is a flow chart showing an error position estimating operation in this embodiment.

Next, a detailed description is made for control by the error position estimating circuit 19. FIG. 5 is a flow chart illustrating operations for estimating an error position under control by the error position estimating circuit 19.

The error position estimating circuit 19 receives a retrieval control signal SCNT from the control circuit 11 and searches to a bit position with the highest error probability among addition result data ADI supplied from the adding circuit 18.

At first, in the error position estimating circuit 19, an addition result ADI [i] (i is a parameter; i=0, 1, . . . , 31) corresponding to each bit position for one word constituting an addition result data ADI is fetched and stored in a memory of the circuit not shown herein (step S31).

Then determination is made as to whether a set-up value of the flag flg is "0" or "1", and if the value is "0", system control shifts to step S33 to initialize the parameters, and if the value is "1", initialization of parameters is not required, so that system control shifts to step S34.

In step S32, a maximum value of each addition result ADI [i] is "2" (10B), the value "2" is set as the maximum value MAXV (for instance, in a register), and the parameter i is set to "0" as a default value. It is assumed that this register MAXV is provided in the error position estimating circuit 19.

After the processing in step S32 or in step S33, determination is made as to whether the parameter i has reached "32" or not (step S34), and until the parameter i reaches "32" whether the addition result ADI [i] has the same value as the maximum value MAXV of "2" or not is determined in step S36.

At first, as the parameter i is "0", if the addition result ADI [0] for bit 0 coincides with the maximum value MAXV of "2" (step S36), it is estimated that the error probability of this bit 0 is the highest in the word. As a result, an estimated error locator LCT with a bit for the bit 0 having been converted to effective bit is outputted to the EOR circuit 20 (step S37).

In a case where it is determined in step S36 that the addition result ADI [0] for bit 0 does not coincide with the maximum value MAXV of "2", system control shifts to step S38, and the parameter i is incremented by 1. Then, if it is determined in step S34 that a value of the parameter is less than "32", again comparison to the maximum value MAXV is executed in the next step S36.

Thus while the addition result ADI [i] does not coincide with the maximum value MAVX, the parameter i is incremented with the bit number changed in the ascending order, and when the parameter i has reached "32" (step S34), it is determined that there is no bit position having a value equal to the maximum value MAXV.

In this case, an operation is executed to decrement the maximum value MAXV by one. Namely, when it is determined in step S34 that the parameter i has reached "32", system control shifts to step S35, the value "2" of the maximum value MAXV is decremented by one, and at the same time the parameter i is returned to "0".

Then like a case where the maximum value MAXV is "2", determination as to whether the addition result ADI [i] coincides with the maximum value MAXV or not is repeated while the parameters i is incremented from "0" to "32". In this step, if it is determined that the addition result ADI [i] for any bit coincides with the maximum value MAXV, it is estimated that the error probability of the bit i corresponding to the addition result ADI [i] is the highest one, and an estimated error locator LCT with a bit for the bit i having been converted to an effective bit is outputted to the EOR circuit 20 (step S37).

As described above, in this embodiment of the present invention, for a correction object word which has not be decoded, an error position for the correction object word is estimated from the error position data for the forward and backward words from the word, the estimated error position is corrected, and again decoding processing is executed, so that continuity of an error can be obtained from a forward or a backward word from the correction object word not decoded, and with this feature a word error ratio in error correction code is reduced and the redecoding capability can be improved.

Also error position data for one block is stored in the error position data memory 16, so that error position data for a forward or a backward word from the correction object word can easily be fetched from the memory.

In addition, a bit position with the highest error probability in one word is estimated as an error position by the error position estimating circuit 19 according to error position data in the forward and backward words, so that an error position close to a correction object word can be estimated with high precision.

Further in the EOR circuit 20, a bit at a bit position for a correction object word corresponding to an estimated error position is inverted, and for this reason it can be assumed that a bit for an error position has been corrected, and decoding can be executed again based on the assumption.

Furthermore, error correction code in this embodiment is BCH error correction code, so that this decoding method is suited for correction of a multiple error.

Figure 6:
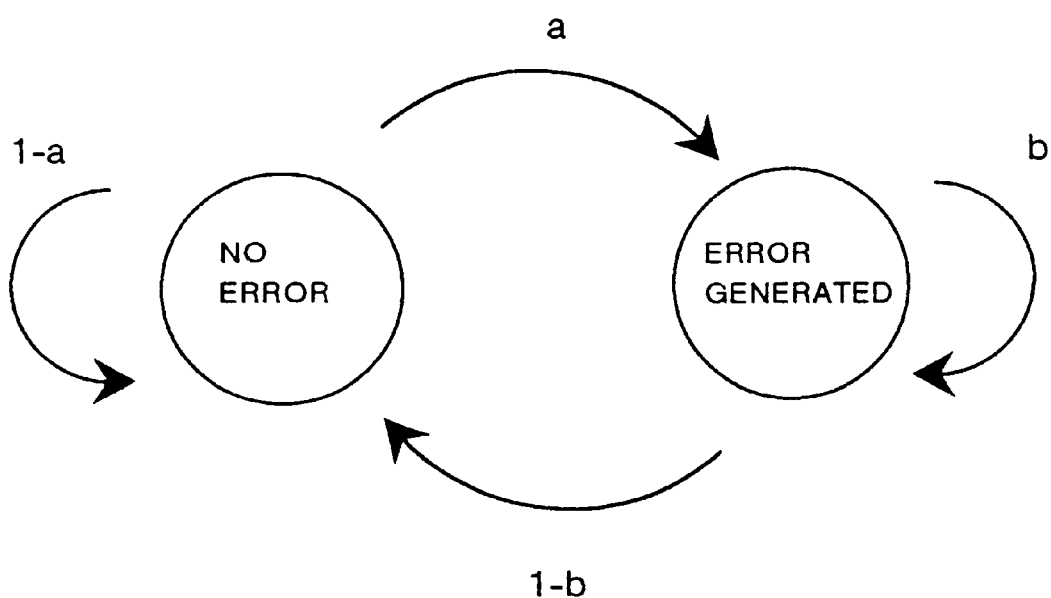
FIG. 6 is a view showing an example of Gilbert model which is applied to generation of a burst error.

Next, a description is made for a result of computer simulation for the decoding apparatus according to the present invention. FIG. 6 shows an example of a Gilbert model applied to generation of a burst error, while FIG. 7 shows an example of BCH code error correction.

As for a method of generating a burst, in this simulation the Gilbert model shown in FIG. 6 is applied to generation of a burst error. In FIG. 6, a indicates probability of generation of a burst error, and b indicates probability of continuity.

In the Gilbert model described above, the stage of no error is shifted according to the probability of generation a to the stage of error generated, and the state of error generated is continued according to the probability of continuity b.

In the decoding section 5 shown in FIG. 1, a result of decoding for the forward word and the backward word from the word not decoded (any of word 0 to 7) is checked, and in a case where either one of the words can be decoded, a bit position with the maximum correction number is regarded as an error position for the word.

Then, BCH decoding is executed again to a word with a bit position for the error position having been inverted, and if decoding can not be executed, the inverted bit for the error position is returned to the original state. With this feature, even if there are continuous bit errors, so long as the error of the word as a whole is within the capability of BCH code correction, a correct word can be obtained.

The example of correction shown in FIG. 7 (BCH (31, 21) interleaved with +even number parity and depth 8) was obtained according to the Gilbert Model described above. In FIG. 7, the bit state '.' indicates a bit position with no error, bit state '1' indicates a bit position corrected by the BCH decoder 13, bit state '2" indicates an error position inverted by the EOR circuit 20, bit state '3' indicates an error position with the bit in the bit state '2' having been corrected, and bit position 'N' indicates an error position not having been corrected.

For this reason, for the words 0, 2, 5 and 7, the bit state '1' is shown, and a result that a result of BCH decoding is acceptable (○) is obtained because the bit state could be corrected by the BCH decoder 13. For word 1, the bit state of :0: is shown indicating that there is no error, and for this reason the result that the BCH decoding is acceptable (○) is obtained.

As for the words 3 and 6, the bit state '2' or '3' is shown, which indicates that the bit state could be corrected by inverting the error position, so the result that the BCH decoding is acceptable (○) is obtained.

As for the word 4, the bit state 'N' is shown, which indicates that the bit state could not be corrected, and the result that the BCH decoding is unacceptable (X) is obtained.

Now, a discussion is made for a result of simulation following the Gilbert Model. FIG. 8 is a view showing an example of the word error ratio characteristics relating to the probability of generation of errors in the computer simulation. FIG. 9 is a view showing an example of the word error ratio characteristics relating to the probability of continuity in a computer simulation.

In FIG. 8, CP1, CP2, CP3 show the word error ratio characteristics curves when b is equal to 0.01, 0.05, and 0.1 respectively. The graph shown in FIG. 8 is plotted with the vertical axis for the word error ratio WER (0.01 to 1) and the horizontal axis for the probability of generation a (0 to 0.1).

The word error ratio characteristics curves CP1, CP2, CP3 show a result obtained by fixing the probability of continuity b and changing the probability of generation a. As clearly shown by the word error ratio characteristics CP1, CP2, CP3 shown in FIG. 8, a result obtained with the BCH decoder based on the conventional technology and that obtained in the decoding section 5 according to the present invention coincide with no difference therebetween as shown by the word error ratio characteristics curves corresponding to the values of b of 0.01, 0.05, and 0.1, respectively.

In FIG. 9, CA and CB show word error ratio characteristics curves corresponding to the values of a of 0.05 and 0.01 respectively when the BCH decoder based on the conventional technology is applied, while PA and PB show word error ratio characteristics curves corresponding to the values of a of 0.05 and 0.01 when the decoding section 5 according to the present invention is applied. The graph in FIG. 9 is plotted with the vertical axis for the word error ratio WER (0.001 to 1) and the horizontal axis for the probability of continuity (0.01 to 0.9).

The word error ratio characteristics curves CA, CB, PA, and PB show a result obtained by fixing the probability of generation a and changing the probability of continuity b respectively. There is no large difference between the BCH decoder based on the conventional technology and that based on the present invention as shown by the word error ratio characteristics curves CA, PA shown in FIG. 9 (Probability of generation a=0.05), but when the probability of continuity b is 0.08, the word error ratio WER in the decoding section 5 according to the present invention was improved by 56% from that obtained with the BCH decoder based on the conventional technology as indicated by the word error ratio characteristics curves CB, PB (Probability of generation a=0.01).

Namely, as shown by a result of computer simulation, it is possible to improve the word error ratio by up to 56% as compared to that in decoders based on the conventional technology, and the result of simulation indicates that the present invention is effective for reduction of a word error ratio.

Next, a description is made for a result of simulation in the environment for fading. Herein description is made for flat fading as an example, and a simulation is made assuming that a person walks at a speed of 4 Km/h carrying a selective caller/receiver (Frequency Fb=1 Hz).

FIG. 10 shows a view showing an example of word error ratio characteristics in a computer simulation under the belt fading environment. In FIG. 10, FC and FP show word error ratio characteristics in a case where a BCH decoder based on the conventional technology and the decoding section 5 in the present invention each under the flat fading environment are applied respectively. The graph shown in FIG. 10 is plotted with the vertical axis for the word error ratio WER (1E−0.2~1E+00) and the horizontal axis for an average of signal power (Eb)/noise power (No) (dB). It should be noted that the word error ratio WER indicates a number of words not corrected/a number of transmitted words.

As clearly shown by the WER characteristics in FIG. 10, the WER for 1.2E−01 was improved by up to approx. 11 dB as shown by the word error ratio characteristics curves FC and FP.

This application is based on Japanese patent application No. HEI 8-245312 filed in the Japanese Patent Office on Sep. 17, 1996 the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A decoding apparatus for decoding an error correction code interleaved on a transmitting side and deinterleaved on a receiving side, comprising:

a determining circuit for checking each word of the error correction code to make determination as to whether decoding is acceptable or not according to a result of decoding;

an error position detector for obtaining error position data by detecting an error position in decoding bit by bit according to the result of decoding;

an estimator for estimating an error position according to error position data detected by said error position detector in a word adjoining a correction object word when said determining circuit determines that decoding is not acceptable;

a correcting circuit for correcting said correction object word according to the error position estimated by said estimator; and a redecoder for executing redecoding processing according to a result of correction by said correcting circuit.

2. A decoding apparatus according to claim 1; wherein said error correction code is a BCH error correction code.

3. A decoding apparatus for decoding an error correction code interleaved on a transmitting side and deinterleaved on a receiving side comprising:

a determining circuit for making determination as to whether decoding is acceptable or not word by word according to a result of decoding;

an error position detector for obtaining error position data by detecting an error position in decoding bit by bit according to the result of decoding;

an estimator for estimating an error position according to error position data detected by said error position detector in a first word before a correction object word as well as to error position data detected by said error position detector in a second word after said correction object word when said determining circuit determines that decoding is not acceptable;

a correcting circuit for correcting said correction object word according to the error position estimated by said estimator; and a redecoder for executing redecoding processing according to a result of correction by said correcting circuit.

4. A decoding apparatus according to claim 3; wherein said error correction code is a BCH error correction code.

5. A decoding apparatus according to claim 3; wherein said error position detector has a memory for storing therein error position data for one block comprising a plurality of words.

6. A decoding apparatus according to claim 5; wherein said error correction code is a BCH error correction code.

7. A decoding means according to claim 5; wherein said estimator estimates a bit position in which the probability of an error is highest in one word as an error position according to error position data for said first word and said second word stored in said memory.

8. A decoding apparatus according to claim 7; wherein said error correction code is a BCH error correction code.

9. A decoding apparatus according to claim 7; wherein said correcting circuit inverts a bit at a bit position of said correction object word corresponding to the error position estimated by said estimator.

10. A decoding apparatus according to claim 9; wherein said error correction code is a BCH error correction code.

11. A decoding method for executing decoding processing to an error correction code interleaved in a transmitting side and deinterleaved in a receiving side comprising:

a first step of determining whether decoding is acceptable or not word by word according to a result of decoding in said decoding processing;

a second step of obtaining error position data by detecting a decoding error position bit by bit according to a result of decoding in said decoding processing;

a third step of estimating an error position for an error correction object word determined that decoding is unacceptable in said first step according to error position data detected in a word adjoining said correction object word in said second step;

a fourth step of correcting said correction object word according to the error position estimated in said third step; and a fifth step of again executing decoding processing according to a result of correction in said fourth step.

12. A decoding method for executing decoding processing to an error correction code interleaved in a transmitting side and deinterleaved in a receiving side comprising:

a first step of determining whether decoding is acceptable or not word by word according to a result of decoding in said decoding processing;

a second step of obtaining error position data by detecting a decoding error position bit by bit according to a result of decoding in said decoding processing;

a third step of estimating an error position for an error correction object word for which decoding is determined unacceptable in said first step, according to error position data detected in a word before said correction object word as well as to the error position data in a word after said correction object word in said second step;

a fourth step of correcting said correction object word according to the error position estimated in said third step; and a fifth step of again executing decoding processing according to a result of correction in said fourth step.

13. A system for decoding data encoded using an error correction code, comprising:

a decoder for decoding input data to produce decoded data, and error position data to indicate positions of errors in a marked word;

a forward error circuit for producing forward error position data to indicate position of errors in a word before said marked word;

a backward error circuit for producing backward error position data to indicate position of errors in a word after said marked word;

an adding circuit for producing a sum of said forward position data and said backward position data;

an error position estimating circuit for locating a bit position of error in the sum of said forward and backward position data; and an error correcting circuit responsive to the located bit position for producing temporarily corrected data supplied to said decoder.

14. The system of claim 13 further comprising a selector for supplying to said decoder the input data or the temporarily corrected data.

15. The system of claim 14 further comprising a control circuit for controlling said selector.

16. The system of claim 15, wherein said decoder further produces acceptance data to indicate whether the input data is acceptable or unacceptable.

17. The system of claim 16, wherein said acceptance data is supplied to said control circuit.

* * * * *